(12) United States Patent
Kohno et al.

(10) Patent No.: US 6,790,734 B2
(45) Date of Patent: Sep. 14, 2004

(54) MANUFACTURING METHOD OF SEMICONDUCTOR DEVICE

(75) Inventors: Michihisa Kohno, Kawasaki (JP); Yuji Shimizu, Kawasaki (JP)

(73) Assignee: NEC Electronics Corporation (JP)

(*) Notice: Subject to any disclaimer, the term of this patent is extended or adjusted under 35 U.S.C. 154(b) by 0 days.

(21) Appl. No.: 10/422,302

(22) Filed: Apr. 24, 2003

(65) Prior Publication Data

US 2003/0228744 A1 Dec. 11, 2003

(30) Foreign Application Priority Data

Apr. 26, 2002 (JP) .................................... 2002-125827
Apr. 17, 2003 (JP) .................................... 2003-112438

(51) Int. Cl.$^7$ .................... H01L 21/336; H01L 21/4763
(52) U.S. Cl. ........................ 438/301; 438/648; 438/627
(58) Field of Search ....................... 438/301, 648, 438/627, 689, 754, 216, 757

(56) References Cited

U.S. PATENT DOCUMENTS

| | | | | |
|---|---|---|---|---|
| 5,989,948 A | * | 11/1999 | Vines et al. | 438/216 |
| 6,336,463 B1 | * | 1/2002 | Ohta | 134/61 |
| 6,410,436 B2 | * | 6/2002 | Yamagata et al. | 438/689 |
| 6,432,815 B2 | * | 8/2002 | Yokoi | 438/627 |
| 6,592,678 B1 | * | 7/2003 | Kamikawa et al. | 134/18 |
| 6,596,630 B2 | * | 7/2003 | Yokoi | 438/648 |
| 6,613,695 B2 | * | 9/2003 | Pomarede et al. | 438/767 |
| 6,627,001 B2 | * | 9/2003 | Chen | 134/3 |
| 6,664,196 B1 | * | 12/2003 | Wada et al. | 438/754 |

FOREIGN PATENT DOCUMENTS

| | | | |
|---|---|---|---|
| JP | 57-501257 | 7/1982 | ......... H01L/21/304 |
| JP | 58-114042 | 8/1983 | ......... H01L/21/304 |
| JP | 03-211831 | 9/1991 | ......... H01L/21/304 |
| JP | 04-142741 | 5/1992 | ......... H01L/21/304 |
| JP | 10-172940 | 6/1998 | ......... H01L/21/304 |
| JP | 2000-223464 | 11/2000 | ......... H01L/21/304 |

OTHER PUBLICATIONS

Y.V. Ponoomarev, et al., "Gate–Workfunction Engineering Using Poly–(Si,Ge) for High Performance 0.18 μm CMOS Technology" IEDM 1997, pp. 829–832.

Wen–Chin Lee, et al. "Optimized Poly–$Si_{1-x}Ge_x$ Gate Technology for Dual Gate CMOS Application" 1998 Symposium on VLSI Technology Digest of Technical Papers, pp. 190–191.

Ja–Hum Ku et al., "High Performance PMOSFETs with $Ni(Si_xGe_{1-x})$ Poly–$Si_{0.9}$ $Ge_{0.2}$ Gate" 2000 Symposium on VLSI Technology Digest of Technical Papers, pp. 114–115.

* cited by examiner

*Primary Examiner*—John F. Niebling
*Assistant Examiner*—Walter L. Lindsay, Jr.
(74) *Attorney, Agent, or Firm*—Hayes Soloway P.C.

(57) ABSTRACT

A manufacturing method of the present invention comprises the steps of patterning to form a gate electrode pattern as well as an oxide film pattern by applying dry etching to a layered film which is formed, on a semiconductor substrate, of an oxide film and a SiGe film, being laid in this order; a first cleaning wherein, after the step of the patterning, the semiconductor substrate is cleaned with a first cleaning solution containing hydrofluoric acid; and a second cleaning wherein, after the step of the first cleaning, the semiconductor substrate is cleaned with a second cleaning solution containing ammonia and hydrogen peroxide.

17 Claims, 3 Drawing Sheets

# MANUFACTURING METHOD OF SEMICONDUCTOR DEVICE

BACKGROUND OF THE INVENTION

1. Field of the Invention

The present invention relates to a manufacturing method of a semiconductor device having a gate electrode which comprises a SiGe layer.

2. Description of the Related Art

In manufacturing a semiconductor device, patterning of a conductive film or an insulating film is carried out by either forming a resist film on the conductive film or the insulating film which is formed on a semiconductor substrate and thereafter forming a resist pattern by photolithography or forming a hard mask pattern of $SiO_2$ or the like thereon, and then applying etching to the conductive film or the insulating film with the pattern being used as a mask. For forming a minute pattern, dry etching is normally employed there at. However, when patterning by dry etching, contaminants such as dry etching products and particles are stuck onto the semiconductor substrate. If contaminants of this sort remain stuck thereon in the subsequent steps, decrease in production yield, deterioration of device characteristics and lower reliability may occur. Therefore, cleaning the semiconductor substrate after patterning is required so as to thoroughly remove the contaminants stuck onto the substrate.

In regards to the cleaning performed after patterning the insulating film, there is disclosed, for instance, in Japanese Patent Application Laid-open No. 142741/1992, an apparatus for manufacturing a semiconductor wherein a semiconductor wafer is treated with a cleaning solution. This publication describes that, after using a hydrofluoric acid based agent (a mixed solution of hydrofluoric acid and ammonium fluoride) for the treatment, a silicon oxide film overlying a silicon semiconductor wafer is patterned by means of wet etching. Then the substrate is treated with a mixed solution of sulfuric acid and hydrogen peroxide to remove the photoresist, and the wafer is cleaned with a mixed solution of ammonia, hydrogen peroxide and pure water to remove particles stuck on the wafer surface. Further, the publication mentions that drying the wafer tends to make particles strongly stuck to the wafer surface, and their removal is considerably difficult, and such a problem can be overcome if the treatment for the removal of the photoresist as well as that for the removal of particles are performed consecutively after wet etching of the silicon oxide film. Further, the publication indicates the apparatus for etching treatment of the silicon oxide film can also be used as an apparatus for etching treatment of the polysilicon film.

Meanwhile, with respect to the cleaning performed after patterning the conductive film, there is disclosed, for instance, in Japanese Patent Application Laid-open No. 223464/2000, that after a layered film made of a refractory metal film (WSi film) and a polycrystalline silicon film is laid on a semiconductor substrate, the layered film is patterned by means of dry etching to form a gate electrode. The substrate is then cleaned with a mixed solution of ammonia and hydrogen peroxide at 35° C. or 45° C. to remove etching residues deposited on the substrate.

In Japanese Patent Application Laid-open No. 223464/2000, it is also mentioned that, if cleaning of the substrate with a mixed solution of ammonia and hydrogen peroxide lasts for a long time period, the lateral faces of the WSi film which constitutes the gate electrode may be excessively dissolved, creating a eroded film section. For the purpose of achieving both the prevention of such a film erosion of the WSi film and the substantially thorough removal of the deposit like dry etching residues, this publication proposes that the cleaning of the substrate is performed only for a specific time period, which is predetermined using the dummy substrate. Further, in the publication, it is described that a contact hole is formed by dry etching in an interlayer insulating film made of a plurality of insulating films (a silicon oxide film, a BPSG (Boro-Phospho-Silicate Glass) film, a BSG (Boro-Silicate Glass) film) which have different etching rates for the wet etching treatment, and that etching residues stuck on the surface of this contact hole are removed by cleaning with a mixed solution of ammonia and hydrogen peroxide. Also in this cleaning, if the treatment time period is set too long, the internal wall of the contact hole becomes uneven due to the differences in the etching rate so that, for the purpose of achieving both prevention of creation of such unevenness and removal of etching residues, this publication proposes that the cleaning is performed only for a specific time period, which is predetermined using the dummy substrate.

In recent years, viewed from the point of improving electrical characteristics of the device, the semiconductor device having a gate electrode which comprises a SiGe layer and a polycrystalline silicon layer has been put forward. For example, a semiconductor device having a gate electrode, wherein a lower layer is a SiGe (poly-$Si_{0.8}Ge_{0.2}$) layer for controlling the work function, and an upper layer is a polycrystalline silicon (poly-Si) layer was proposed and its device characteristics were also described in detail (Y. V. Ponomarev et al., IEDM' 97, p.829).

Further, a semiconductor device having a gate electrode comprising a SiGe (poly-$Si_{1-x}Ge_x$) layer which is doped with P or B was reported (Wen-Chin Lee et al., 1998 Symposium on VLSI Technology Digest of Technical Papers, p. 190). There was also described a semiconductor device having a gate electrode ($Ni(Si_xGe_{1-x})$/poly-$Si_{0.8}Ge_{0.2}$) which is formed by growing Ni/TiN on a SiGe (poly-$Si_{0.8}Ge_{0.2}$) layer and applying the annealing thereto (Ja-Hum Ku et al., 2000 Symposium on VLSI Technology Digest of Technical Papers, p. 114).

A gate electrode pattern made of a SiGe layer and a polycrystalline silicon layer is formed by applying layers of an oxide film, a SiGe film and a polycrystalline silicon film, in this order, over a semiconductor substrate and forming a resist film on this layered film, and thereafter forming a resist pattern by photolithography and then dry etching the layered film with this resist pattern being used as a mask. However, after patterning is made by dry etching in this way and thereby a gate electrode pattern as well as a gate oxide film pattern are formed, dry etching products formed by the chemical reaction between the etching gas and the objects for etching and particles are left stuck onto the semiconductor substrate surface and the gate electrode. Therefore, it is required to clean the semiconductor substrate so as to remove such contaminants.

Yet, for removing dry etching products and particles which are stuck onto the semiconductor substrate and the gate electrode, if cleaning is carried out by the conventional cleaning method using a mixed solution of ammonia and hydrogen peroxide, there may arise a problem of film erosion of the lateral faces (referred to as "side etch", hereinafter) of the SiGe layer.

Referring to FIG. 2, the above problem of the conventional cleaning method is further described below. FIG. 2(a) is a schematic cross-sectional view of a semiconductor substrate after formation of a gate electrode pattern and a gate oxide film pattern but before cleaning, and FIG. 2(b) is a schematic cross-sectional view of a semiconductor substrate after cleaning. In the drawings, referential numeral 1 represents a semiconductor substrate; 2, a gate oxide film; 3, a SiGe layer; 4, a polycrystalline silicon film and 5, an element isolation region.

As described above, when a layered film comprising a SiGe film is dry etched, using a resist pattern as a mask (FIG. 2(a)), dry etching products and particles (not shown in the drawings) are stuck onto the semiconductor substrate surface and the gate electrode. In order to remove the dry etching products and the particles which are stuck onto the semiconductor substrate, a mixed solution of ammonia and hydrogen peroxide used in the conventional cleaning method may be still employed. But, to achieve satisfactory removal of dry etching products, the ammonia concentration and the temperature of the mixed solution must high. The reason for the high ammonia concentration is that the dry etching products originating from the SiGe layer has difficulty dissolving into this mixed solution.

However, when cleaning is performed using the mixed solution with a high ammonia concentration at a high temperature so as to remove the dry etching products thoroughly, the SiGe layer 3 becomes side etched, as shown in FIG. 2(b). This results from a high solubility the SiGe layer has for this mixed solution, and, in the case of the SiGe layer containing not less than 10 atomic % of Ge and especially not less than 20 atomic % of Ge, this problem of side etching of the SiGe layer becomes far more serious. Such a side etching of the SiGe layer within a gate electrode may bring about defective device operations.

In effect, with the conventional cleaning method wherein a mixed solution of ammonia and hydrogen peroxide is utilized as a cleaning solution for cleaning (a cleaning agent), it is highly difficult to achieve thorough removal of dry etching products and particles which are stuck on the semiconductor substrate, while preventing side etching of the SiGe layer. In addition, for attaining excellent device characteristics, it is essential not to damage the gate oxide film, either.

Accordingly, an object of the present invention is to manufacture, in a high yield, a semiconductor device having excellent device characteristics and good reliability by performing, by means of dry etching, patterning of a layered film which comprises a SiGe film containing Si and Ge and an oxide film to form a gate electrode pattern and a gate oxide film pattern, and thereafter removing thoroughly dry etching products and particles which are stuck onto the semiconductor substrate, without damaging the SiGe layer and the gate oxide film which constitute the gate.

SUMMARY OF THE INVENTION

The present invention provides a method of manufacturing a semiconductor device having, on a semiconductor substrate, a gate oxide film and a gate electrode which comprises a SiGe film containing Si and Ge which method comprises the steps of:

a patterning to form a gate electrode pattern as well as an oxide film pattern by applying dry etching to a layered film which is formed, on the semiconductor substrate, of an oxide film and the SiGe film, being laid in this order;

a first cleaning wherein, after the step of the patterning, the semiconductor substrate is cleaned with a first cleaning solution containing hydrofluoric acid; and a second cleaning wherein, after the step of the first cleaning, the semiconductor substrate is cleaned with a second cleaning solution containing ammonia and hydrogen peroxide.

Further, the present invention provides a method of manufacturing a semiconductor device, wherein:

an ammonia concentration in the second cleaning solution is 0.05%–1.5 weight %; and a content ratio (by weight) of hydrogen peroxide to ammonia in the second cleaning solution is not less than 1 (hydrogen peroxide/ammonia).

Further, the present invention provides a method of manufacturing a semiconductor device, wherein, in the step of the second cleaning, the temperature of the second cleaning solution in use is not higher than 45° C.

Further, the present invention provides a method of manufacturing a semiconductor device, wherein a hydrogen fluoride concentration in the first cleaning solution is 0.05 weight %–1.0 weight %.

In the present invention, after a layered film wherein an oxide film and a SiGe film are laid in this order is patterned by means of dry etching and thereby a gate electrode pattern and a gate oxide film pattern are formed, cleaning to remove etching products and particles is carried out in two steps, that is, the step of first cleaning suited to remove etching products and the step of second cleaning suited to remove particles. As a result, in each cleaning step, the cleaning solution optimal to remove each of the contaminants therein can be used so that excellent cleaning effects can be obtained. Moreover, because each employed cleaning solution has a strong cleaning effect on its contaminants for the removal and besides the concentration and the composition of the cleaning solution as well as cleaning conditions can be chosen specifically for each cleaning step, the dissolving powers of the cleaning solution for the SiGe layer and the gate oxide film and, in other words, side etching to the SiGe layer and the gate oxide film can be well suppressed, while securing the cleaning effect on the contaminants for the removal satisfactorily.

In the present invention, an object of the step of first cleaning is to remove mainly dry etching products and, therein, the semiconductor substrate is cleaned with the first cleaning solution containing hydrofluoric acid. The present inventors recognized that hydrofluoric acid utilized as the first cleaning solution has a very strong removing power on dry etching products but not on particles. In general, hydrofluoric acid is known to have a strong removing power over oxides and, thus, its use as a cleaning agent in a state where the gate oxide film is exposed is thought to cause damage to the gate oxide film. However, it was found out that as a removing power of hydrofluoric acid on dry etching products is very strong, even if its removing power is somewhat weakened by lowering its concentration in the cleaning solution, dry etching products can be removed still satisfactorily. In effect, in the present invention, the use of hydrofluoric acid as the first cleaning solution makes it possible to remove dry etching products satisfactorily, while suppressing well the side etch of the gate oxide film. Furthermore, the first cleaning solution containing hydrofluoric acid has such a low etching rate for the SiGe layer that the side etch the SiGe layer in the step of first cleaning can be neglected.

In the present invention, an object of the step of second cleaning is to remove mainly particles and, therein, the semiconductor substrate is cleaned with the second cleaning solution made of a mixed solution of ammonia and hydrogen peroxide. The present inventors recognized that a mixed solution of ammonia and hydrogen peroxide utilized as the second cleaning solution has a very strong removing power on particles in a specific composition range but not on dry etching products. Although a mixed solution of ammonia and hydrogen peroxide is widely known as a cleaning agent, it has a very high etching rate of the SiGe layer at a conventionally employed concentration, and, thus, when used in the step of second cleaning, a considerable side etch of the SiGe layer may be brought about, though its removal of particles is satisfactory. However, the present inventors found out that as far as the content ratio of hydrogen peroxide to ammonia is confined within a specific range, even if its etching rate of the SiGe layer is far reduced by lowering the concentration of the cleaning solution, such a removing power on particles as required in the present invention can be still readily obtained. In effect, in the present invention, the use of a mixed solution of ammonia and hydrogen peroxide as the second cleaning solution makes it possible to remove particles satisfactorily, while suppressing well the side etch of the SiGe layer. Furthermore, the second cleaning solution made of a mixed solution of ammonia and hydrogen peroxide has such a low etching rate for the gate oxide film that the side etch of the gate oxide film in the step of second cleaning can be neglected.

As described above, in the present invention, after a layered film having, on a semiconductor substrate, an oxide film and a SiGe film in this order is patterned by dry etching and thereby a gate electrode pattern and a gate oxide film pattern are formed, the semiconductor substrate is cleaned in two steps, namely, in the step of first cleaning for removing mainly dry etching products and in the step of second cleaning for removing mainly particles, whereby dry etching products and particles which are stuck on the semiconductor substrate can be removed satisfactorily, while suppressing the side etching of the SiGe layer which constitutes the gate electrode as well as the gate oxide film. As a result, a semiconductor device with excellent device characteristics and good reliability may be manufactured with a high yield.

DETAILED DESCRIPTION OF THE INVENTION AND PREFERRED EMBODIMENTS

Preferred embodiments of the present invention are described below.

Figure 1:
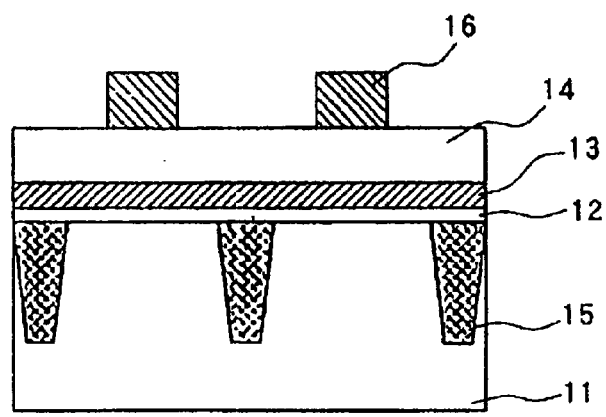
FIG. 1 is a series of views in explaining a manufacturing method of a semiconductor device according to the present invention.
Figure 1:
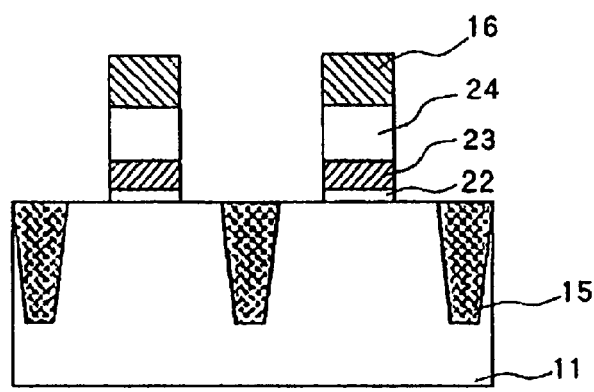
Figure 1:
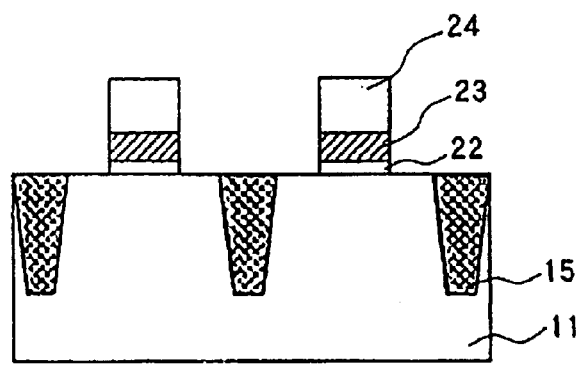
Figure 2A:
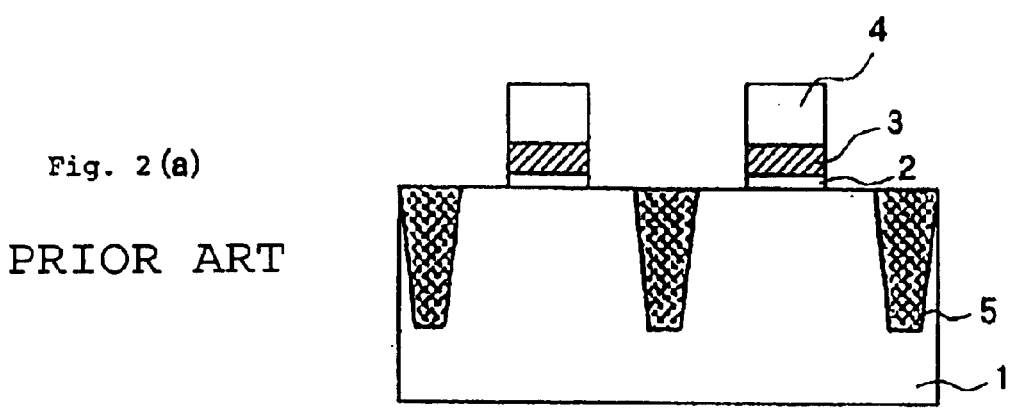
FIG. 2 is a pair of views in explaining problems of the conventional cleaning method of a semiconductor substrate.
Figure 2B:
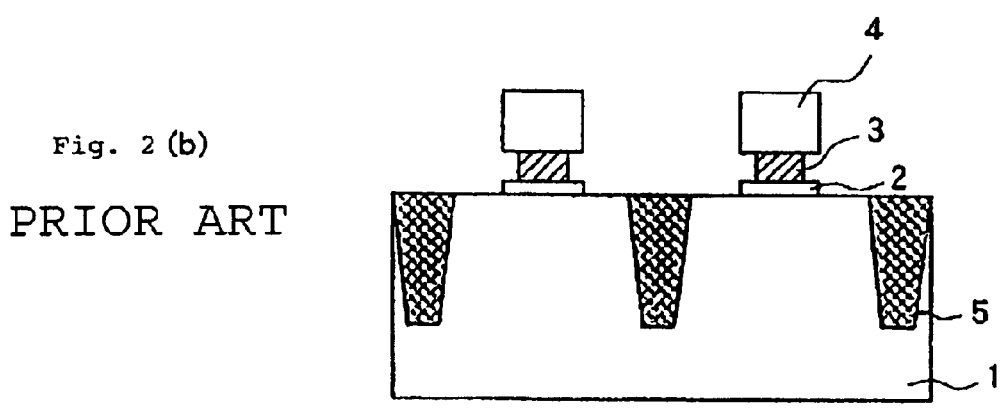

Referring to FIG. 1, a method of manufacturing a semiconductor device having a gate electrode which comprises a SiGe layer according to the present invention is described in detail.

First, on a silicon substrate 11 in which an element isolation region 15 is formed, a silicon oxide film 12 which is to serve as a gate oxide film 22 after being treated, for instance, by the thermal oxidation method is formed. The thickness of the silicon oxide film may be set appropriately, for example, within a range of 1 nm–10 nm.

Next, on the silicon oxide film 12, a SiGe film 13 is formed, for example, by the LP-CVD (Low Pressure Chemical Vapor Deposition) method. The thickness of this SiGe film may be set appropriately, for example, within a range of 1 nm–400 nm. Further, although the composition of the SiGe film may be determined appropriately, from the viewpoint of device characteristics, the Ge content may be set in a range of 10 atomic %–40 atomic % or 20 atomic %–40 atomic %. Provided the SiGe layer is a two-components system of Si and Ge, the Si content may be hereat set in a range of 90 atomic %–60 atomic % or 80 atomic %–60 atomic %. Further, according to the required device characteristics, n-type dopants (As, P, Sb or such) or p-type dopants (B or such) can be doped into the SiGe layer. Further, the SiGe layer may contain other elements as far as the required characteristics could be obtained. The step of cleaning in the present invention is highly effective when the Ge content of the SiGe layer is in a range of 10 atomic %–40 atomic % and particularly in a range of 20 atomic %–40 atomic %.

Next, a conductive material film 14 is formed on the SiGe film 13. The thickness of this conductive material film may be set appropriately, for example, within a range of 10 nm–400 nm. For this conductive material film, a polycrystalline silicon film may be utilized, and, in that case, the conductive material film can be formed, for example, by growing a polycrystalline silicon film by the CVD (Chemical Vapor Deposition) method with n-type dopants (As, P, Sb or such) or p-type dopants (B or such) either added thereinto during the growth or injected thereinto by the ion implantation method after the growth.

Further, in the present invention, the gate electrode may be solely composed of a SiGe layer doped with n-type dopants or p-type dopants. In this case, without forming any conductive material film 14 on the SiGe film 13, the next step, namely, the step of forming a resist pattern 16 is carried out.

Next, after a resist film is formed by applying a coating of photoresist onto the conductive material film 14, a prescribed resist pattern 16 is formed by photolithography (FIG. 1(*a*)).

Using this resist pattern 16 as a mask, the conductive material film 14, the SiGe film 13 and the silicon oxide film 12 are then dry etched to form a gate electrode made of a SiGe layer 23 and a conductive material layer 24 as well as a gate oxide film 22 (FIG. 1(*b*)). The conditions of the dry etching may be set appropriately, and, for instance, the reactive ion etching method using $Cl_2$, HBr or the like as the etching gas can be employed.

After the gate electrode and the gate oxide film are formed by patterning carried out through dry etching as described above, the substrate is subjected to a treatment with a third cleaning solution and the resist pattern 16 overlying the conductive material layer 24 is removed (FIG. 1(*c*)). For the third cleaning solution, a mixed solution of sulfuric acid and hydrogen peroxide may be utilized. The composition of the third cleaning solution and its temperature in use may be determined appropriately by a known method. As for the composition of the third cleaning solution, sulfuric acid and 30 wt. % hydrogen peroxide are preferably in the volume ratio of 3:1–8:1. Further, the temperature of the third cleaning solution in use is preferably set to be 100° C.–150° C.

After the resist pattern 16 is removed by treating the semiconductor substrate with the third cleaning solution, the step of rinsing with pure water can be performed if circumstances require. That is, the substrate can be washed with water either by spraying pure water onto the substrate or by dipping the substrate into pure water.

Next, with the object of removing mainly dry etching products, the substrate is cleaned with a first cleaning solution containing of hydrofluoric acid (the step of first cleaning). For this cleaning, both the spray method and the dipping method are applicable. The spray method is a method of cleaning the substrate by spraying a cleaning solution thereat, preferably while rotating the substrate, and the dipping method is a method of cleaning the substrate by dipping it into a bath (a cleaning solution treatment bath) where a cleaning solution is stored.

The hydrogen fluoride concentration in the first cleaning solution is set to be preferably not less than 0.05 wt. %, more preferably not less than 0.1 wt. % and particularly preferably not less than 0.13 wt. %. Further, the hydrogen fluoride concentration in the first cleaning solution is set to be preferably not greater than 1.0 wt. %, more preferably not greater than 0.9 wt. %, still more preferably not greater than 0.8 wt. % and particularly preferably not greater than 0.7 wt. %. As the concentration in the first cleaning solution is set higher, the power of removing the dry etching products becomes stronger, but when the concentration of the cleaning solution becomes excessively high, the etching rate of the gate oxide film becomes considerably high and even may become high enough to give rise to a problem of side etch. Further, at an excessively high concentration of the cleaning solution, the cleaning time period must be set short from the viewpoint of side etch prevention, which makes the dry etching products liable to remain and the cleaning operations difficult to control in respect of cleaning time period. On the other hand, at a low concentration of the cleaning solution, the etching rate of the gate oxide film becomes low so that the side etch of the gate oxide film can be well suppressed but the power of removing the dry etching products drops. In effect, if the composition of the first cleaning solution is set within the foregoing range, the dry etching products stuck onto the semiconductor substrate can be removed still more satisfactorily, while the side etch of the gate oxide film can be well suppressed.

The first cleaning solution may contain other additive components according to the requirement, as long as its very required effect is not impaired.

The temperature of the first cleaning solution in use is set preferably at or below 40° C., more preferably at or below 35° C. and particularly preferably at or below 30° C. By setting the temperature of the first cleaning solution in use in the above range, the side etch of the gate oxide film can be well suppressed. Further, the temperature of the first cleaning solution in use is set preferably at or above 5° C., more preferably at or above 10° C. and particularly preferably at or above 15° C. By setting the temperature of the first cleaning solution in use in the above range, the dry etching products stuck onto the semiconductor substrate can be removed more satisfactorily.

The time period for the treatment with the first cleaning solution (the cleaning time period) may be set appropriately, according to the concentration, the composition and the temperature of the first cleaning solution, the amount and the type of the dry etching products stuck onto the substrate and the cleaning method. Viewed from the point of suppression of the side etch of the gate oxide film as well as the point of treatment efficiency, it is preferable not to perform the cleaning of the substrate for a much longer time period than necessary to remove the dry etching products satisfactorily.

As one example of the step of first cleaning described above, there can be given the step wherein cleaning with a first cleaning solution of 0.17 wt. % hydrogen fluoride at a temperature of 20° C. is carried out by the spray method for a treatment time period of 3 minutes–6 minutes.

Following the step of first cleaning, the step of rinsing with pure water can be performed if circumstances require.

After the semiconductor substrate is cleaned with the first cleaning solution containing hydrofluoric acid and, then, rinsed with pure water, if circumstances require, as described above, the semiconductor substrate is cleaned, with the object of removing mainly particles, with a second cleaning solution containing ammonia and hydrogen peroxide (the step of second cleaning). For this cleaning, both the spray method and the dipping method are applicable.

The ammonia concentration in the second cleaning solution is set to be preferably not less than 0.05 wt. %, more preferably not less than 0.1 wt. % and particularly preferably not less than 0.2 wt. %. Further, the ammonia concentration in the second cleaning solution is set to be preferably not greater than 1.5 wt. %, more preferably not greater than 1.4 wt. %, still more preferably not greater than 1.3 wt. % and particularly preferably not greater than 1.2 wt. %.

The content ratio of hydrogen peroxide to ammonia (the amount of hydrogen peroxide/the amount of ammonia; by weight) in the second cleaning solution is set to be preferably not less than 1, more preferably not less than 1.1 and particularly preferably not less than 1.2. Further, the content ratio of hydrogen peroxide to ammonia (the amount of hydrogen peroxide/the amount of ammonia; by weight) in the second cleaning solution is set to be preferably not greater than 5, more preferably not greater than 3 and particularly preferably not greater than 2.

The etching rate of the SiGe layer has a decreasing tendency with lower ammonia concentrations in the second cleaning solution, but when the ammonia concentration becomes excessively low, the power of removing particles tends to become small. Meanwhile, as the content ratio of hydrogen peroxide to ammonia in the second cleaning solution increases, up to a specific ratio, the power of removing particles of the cleaning solution has an increasing tendency. Further, in respect of cost, it is not desirable to set the content ratio of hydrogen peroxide to ammonia in the cleaning solution too high. Consequently, if the composition of the second cleaning solution is set within the foregoing range, the particles stuck onto the semiconductor substrate can be removed still more satisfactorily, while the side etch of the SiGe layer can be well suppressed.

Figure 3:
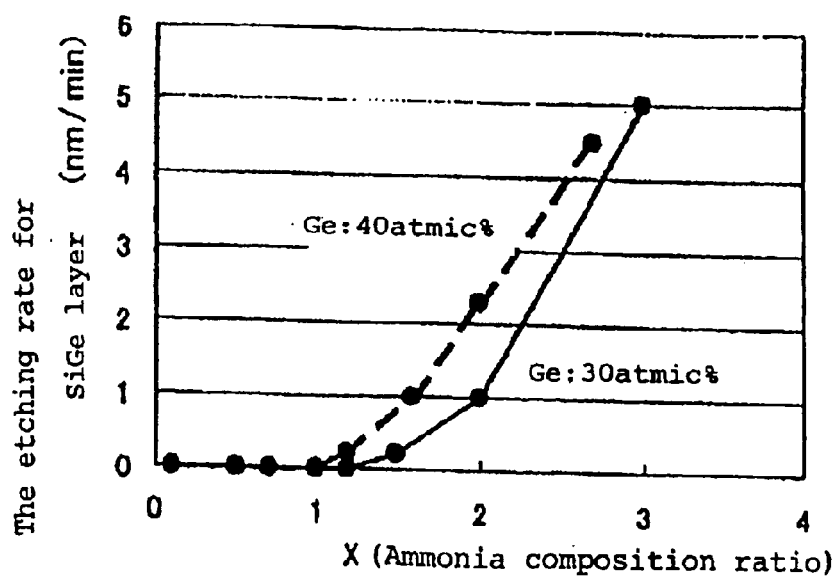
FIG. 3 is a graphical representation showing the relationship between the ammonia composition ratio (X) in the second cleaning solution and the etching rate of the SiGe film.

A relationship between the ammonia composition ratio (X) in the second cleaning solution and the etching rate of the SiGe film is shown in FIG. 3. This result was obtained through measurements of the film thicknesses of the SiGe layer before and after the treatment wherein a substrate on which a SiGe film was laid was immersed, for a prescribed time period, into a cleaning solution at a temperature of 35° C., the composition of the cleaning solution being 30 wt. % ammonia:30 wt. % hydrogen peroxide:water=X:1:50 (volume ratio). As for the SiGe films, films comprising 70 atomic % of Si and 30 atomic % of Ge (a solid line) and films comprising 60 atomic % of Si and 40 atomic % of Ge (a dotted line) were used.

FIG. 3 indicates that the etching rate of the SiGe film heavily depends on the ammonia composition ratio (X) in the second cleaning solution employed, in other words, the ammonia concentration thereof, and that, above a specific ammonia concentration, the etching rate of the SiGe film has an increasing tendency with higher ammonia concentrations. Further, it is demonstrated that with the same cleaning solutions, the etching rate of the SiGe layer tends to increase as the Ge content in the SiGe layer becomes higher. Therefore, in order to keep the etching rate of the SiGe film low and suppress the side etch to the SiGe film, it is essential to set the ammonia concentration in the cleaning solution low. In particular, it is clearly seen that if the ammonia composition ratio (X) of the cleaning solution is set to be not greater than 1, the etching of the SiGe layer can be almost completely prevented from occurring, regardless of the Ge content.

Figure 4:
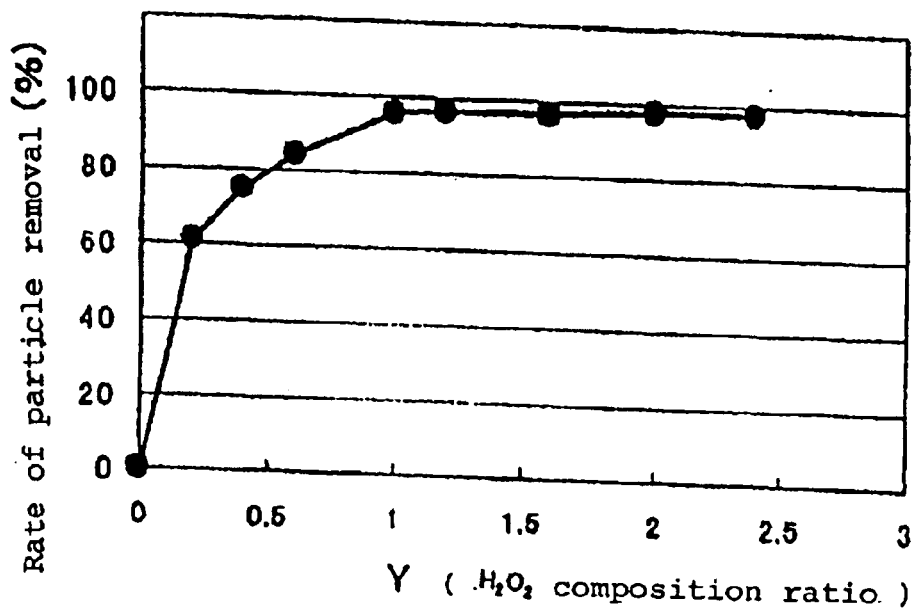
FIG. 4 is a graphical representation showing the dependence of the rate of particle removal on the hydrogen peroxide composition ratio (Y) in the second cleaning solution.

The dependence of the rate of particle removal on the hydrogen peroxide composition ratio (Y) in the cleaning solution is shown in FIG. 4. This result was obtained through measurements of the particle numbers before and after the treatment wherein, after a layered film, made of an oxide film, a SiGe film (70 atomic % of Si and 30 atomic % of Ge) and a polycrystalline silicon film and laid on a silicon substrate, was patterned by dry etching, the substrate was cleaned by the spray method for 1 minute with a cleaning solution at a temperature of 35° C., the composition of the cleaning solution being 30 wt. % ammonia:30 wt. % hydrogen peroxide:water=1:Y:50 (volume ratio).

FIG. 4 indicates that the rate of particle removal depends on the hydrogen peroxide composition ratio (Y) in the second cleaning solution employed, and that, up to a specific rate, the rate of particle removal has an increasing tendency with higher hydrogen peroxide composition ratios. Further, it was confirmed that the rate of particle removal hardly depends on the Ge content in the SiGe layer. Therefore, in order to remove particles thoroughly, the content ratio of hydrogen peroxide to ammonia in the cleaning solution is the matter of importance, and especially under the above conditions such a high rate of particle removal as 95% or higher can be attained by making the hydrogen peroxide composition ratio (Y) not less than 1.

As described above, in the step of second cleaning wherein the substrate is cleaned with the second cleaning solution (a mixed solution of ammonia and hydrogen peroxide), the ammonia concentration in the cleaning solution is important for suppressing the side etch of the SiGe layer. The lower the ammonia concentration in the cleaning solution is set, especially below a specific concentration, the more the etching rate of the SiGe layer can be reduced, in other words, the better the side etch can be suppressed. Meanwhile, to obtain a satisfactory rate of particle removal, the content ratio of hydrogen peroxide to ammonia in the cleaning solution is the matter of importance. The rate of particle removal has an increasing tendency with higher content ratios of hydrogen peroxide to ammonia in the cleaning solution, up to a specific ratio. In effect, by making a proper adjustment for mixing ratios of ammonia, hydrogen peroxide and water in preparation of the cleaning solution, and especially by setting them within the foregoing ranges therein, it is possible to attain a high rate of particle removal while suppressing the side etch of the SiGe layer well.

The second cleaning solution may contain other additive components according to the requirement, as long as its very required effect is not impaired.

From the viewpoints of suppressing the side etch of the SiGe layer and controlling the temperature, the temperature of the second cleaning solution in use is set preferably at or below 45° C., more preferably at or below 40° C. and particularly preferably at or below 35° C. Further, the temperature of the second cleaning solution in use is set preferably as close to the ambient temperature as possible, in respect of the temperature control and the energy cost, and, for example, is set preferably at or above 5° C., more preferably at or above 10° C. and particularly preferably at or above 15° C., with the above temperature ranges being respective upper limits.

Figure 5:
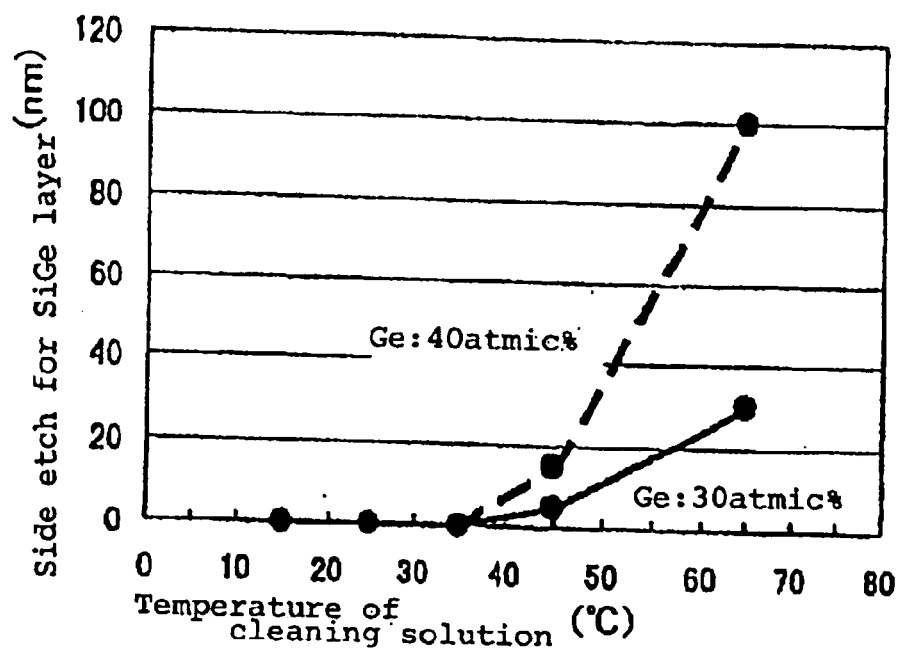
FIG. 5 is a graphical representation showing the relationship between the temperature of the second cleaning solution and the amount of side etch of the SiGe layer.

The relationship between the temperature of the second cleaning solution and the amount of side etch of the SiGe layer is shown in FIG. 5. The result was obtained by the cross-sectional view observations with a SEM (Scanning Electron Microscope) through measurements of the amount of side etch of the SiGe layer brought about by a treatment wherein, after a layered film, made of an oxide film, a SiGe film and a polycrystalline silicon film and laid on a silicon substrate, was patterned by dry etching, the substrate was cleaned by the spray method for 1 minute with a cleaning solution, the composition of which was 30 wt. % ammonia:30 wt. % hydrogen peroxide:water=1:1:50 (volume ratio). As for the SiGe films, films comprising 70 atomic % of Si and 30 atomic % of Ge (a solid line) and films comprising 60 atomic % of Si and 40 atomic % of Ge (a dotted line) were used.

FIG. 5 indicates that the amount of side etch of the SiGe layer heavily depends on the temperature of the second cleaning solution employed, and that, above a specific temperature, the amount of side etch of the SiGe layer has an increasing tendency with higher temperatures of the cleaning solution. Further, it is demonstrated that, with the cleaning solutions at the same temperature, the amount of side etch of the SiGe layer tends to increase as the Ge content in the SiGe layer becomes higher. Therefore, in order to suppress the side etch to the SiGe layer, it is essential to set the temperature of the cleaning solution low. In particular, it is clearly seen that if the temperature of the cleaning solution for use is set at or below 35° C., the side etch of the SiGe layer can be almost completely prevented from occurring, regardless of the Ge content.

When using a relatively concentrated, mixed solution of ammonia and hydrogen peroxide at a relatively high temperature, the cleaning of the semiconductor substrate by the conventional cleaning method is carried out after forming the gate electrode pattern as well as the gate oxide film pattern through patterning made by dry etching, the gate oxide film is subjected to the side etch in a certain extent, though not so much as the SiGe layer. In consequence, in the conventional cleaning method, the cleaning conditions are adjusted so as to make the amount of this side etch of the gate oxide film confined within a permissible range, for instance, 1 nm or less, where resulting deterioration of device characteristics can be neglected. As against this, in the present invention, since the second cleaning solution made of a mixed solution of ammonia and hydrogen peroxide can be made more diluted than the cleaning solution conventionally used, it is possible to suppress well or even prevent the side etch of the gate oxide film by the second cleaning solution in the step of second cleaning. Furthermore, because the side etch of the gate oxide film can be well suppressed or even prevented in the step of second cleaning, the permissible range for the amount of the side etch of the gate oxide film can be well spared and, as a result, even if, in the step of first cleaning, hydrofluoric acid known to have considerable etching power for oxides is employed as the first cleaning solution, removal of etching products may be well carried through, while limiting the amount of the side etch of the gate oxide film within the permissible range.

The time period for the treatment with the second cleaning solution (the cleaning time period) may be set appropriately, according to the composition of the SiGe layer, the concentration, the composition and the temperature of the second cleaning solution. Viewed from the point of suppression of the side etch of the SiGe layer as well as the point of treatment efficiency, it is preferable not to perform the cleaning of the substrate for a much longer time period than necessary to remove the particles satisfactorily.

As one example of the step of second cleaning described above, there can be given the step wherein cleaning with a second cleaning solution at a temperature of 35° C., the composition of the second cleaning solution being 30 wt. % ammonia:30 wt. % hydrogen peroxide:water=1:1:50 (volume ratio), is carried out by the spray method for a treatment time period of 30 seconds-2 minutes.

Following the step of second cleaning, the step of rinsing with pure water can be performed if circumstances require.

After the substrate is cleaned with the second cleaning solution containing ammonia and hydrogen peroxide and, then, rinsed with pure water, if circumstances require, as described above, the substrate may be dried by a known method such as the spin dry method.

In the present embodiment, as described above, after the gate electrode comprising a SiGe layer and the gate oxide film is formed by patterning carried out through dry etching, the semiconductor substrate is subjected to a treatment with a third cleaning solution to remove the resist, and then the semiconductor substrate is cleaned with a first cleaning solution containing hydrofluoric acid and finally the semiconductor substrate is cleaned with a second cleaning solution containing ammonia and hydrogen peroxide. In this way, the dry etching products as well as particles which are stuck onto the semiconductor substrate can be removed satisfactorily, while suppressing the side etch of the SiGe layer and the gate oxide film. Accordingly, in the present invention, a rate of particle removal of not less than 90% or even not less than 95% may be attained and besides dry etching products may be removed so thoroughly as not to be observed afterwards even by the SEM. Still, hereat, the amount of the side etch of the SiGe layer in the gate electrode may be made not greater than 1 nm or even not greater than 0.5 nm and, in addition, the amount of the side etch of the gate oxide film may be made not greater than 1 nm or even not greater than 0.5 nm.

Although, in the present embodiment, the substrate is treated with the third cleaning solution to remove the resist pattern after the gate electrode pattern as well as the gate oxide pattern are formed, but prior to the step of first cleaning, the removal of the resist pattern can be performed after the step of first cleaning but before the step of second cleaning. Nevertheless, viewed from the point of particle removal, it is preferable to remove the resist pattern after the gate electrode pattern as well as the gate oxide film pattern are formed but prior to the step of first cleaning.

Further, in the present invention, it is preferable that, between the step of patterning (the step of forming the gate electrode pattern as well as the gate oxide film pattern) and the step of second cleaning, the step of drying the semiconductor substrate is not performed after the semiconductor substrate is treated with a liquid. If the surface of the semiconductor substrate is kept wet all the time without performing the step of drying the semiconductor substrate after cleaning solution treatments (cleaning, removal of the resist), pure water rinsing and the like, the particles are prevented from sticking onto the semiconductor substrate so that the particles can be readily removed by the cleaning. Hereat, "the step of drying the semiconductor substrate" implies the step of performing a treatment to dry the substrate, for instance, the spin dry method, and this does not include natural drying taking place between the step of one cleaning solution treatment and the step of the next cleaning solution treatment. Nevertheless, the shorter the interval between the step of one cleaning solution treatment and the step of the next cleaning solution treatment is, the better it is.

In this respect, when cleaning is performed by the spray method, it is preferable that, in proceeding from the step of one cleaning solution treatment to the step of the next cleaning solution treatment, the substrate is not taken out from the apparatus of cleaning and a quick change for the cleaning solution used in the step is made. Further, when a chemical treatment such as cleaning is performed by the dipping method, it is preferable that the time period and the temperature are controlled so as not to make permit the cleaning solution adhering on the semiconductor substrate to dry up while the semiconductor substrate is transferred from the bath for one cleaning solution treatment to the bath for the next cleaning solution treatment; or alternatively the semiconductor substrate is not pulled out from the cleaning solution in the bath for the cleaning solution treatment at all and the cleaning solution in the bath is gradually replaced by the next one.

Next, one embodiment of a cleaning apparatus favorably used in the present invention is described below.

As one example of an apparatus for the spray type cleaning that is favorably used in the present invention, there can be given an apparatus which has, in a treatment chamber, a holder for positioning a semiconductor substrate and means for rotating the positioned semiconductor substrate, wherein spray nozzles are set in the treatment chamber in such a way that these spray nozzles can discharge the liquid at the rotating semiconductor substrate. These spray nozzles may be able to discharge inert gas which is to be introduced in drying the semiconductor substrate in the final stage. Further, with regard to the arrangement of these spray nozzles, a different group of spray nozzles may be set separately for each discharge substance (cleaning solution, pure water, inert gas and the like) or each spray nozzle may be able to discharge at least two kinds of discharge substances. In order to make discharge of two or more kinds of substances from one and the same nozzle possible, a changeover valve may be installed on the supply lines connecting to the spray nozzles so that, after a given cleaning solution, pure water or such is discharged, exchange of lines may be made by the valve to allow the next cleaning solution, pure water or such to be discharged. Through the use of such a cleaning apparatus, exchange of the discharge substances for use among cleaning solutions and pure water can be promptly made. Cleaning solutions and pure water sprayed at the substrate are, as waste fluid, drained out of the treatment chamber from the waste fluid outlet.

Further, as the cleaning apparatus, a single substrate processing type apparatus in which semiconductor substrates are treated one by one may be employed or a spray type cleaning apparatus having, in the treatment chamber, one or more carriers on which a plurality of semiconductor substrates are to be disposed at given intervals and means for rotating the carrier(s), in which at least one spray nozzle is set around the carrier(s) may be utilized.

Further, as an apparatus other than the spin type one, there may be used, for instance, a cleaning apparatus which comprises a container wherein a plurality of substrates are to be put in at given intervals and a plurality of nozzles which are set above this container and preferably movable with respect to the container.

As an apparatus for the dipping type cleaning that is favorably used in the present invention, there can be given an apparatus, wherein a first cleaning solution treatment bath storing hydrofluoric acid, a first pure water rinse bath, a second cleaning solution treatment bath storing a mixed solution of ammonia and hydrogen peroxide and a second pure water rinse bath are set, in succession, in this order. Further, either prior to the first cleaning solution treatment bath or between the first pure water rinse bath and the second cleaning solution treatment bath, there may be set a third cleaning solution treatment bath storing a mixed solution of sulfuric acid and hydrogen peroxide for the resist removal and a subsequent third pure water rinse bath. Further, the apparatus can be equipped with a mechanism for transporting the carrier on which substrates are carried automatically to respective treatment baths. Further, the apparatus can comprise means for shaking or rotating carriers in the cleaning solution treatment bath or means for bubbling with nitrogen gas or the like in the cleaning solution. Further, following the second pure water rinse bath, a drying treatment section for drying the semiconductor substrate may be set up.

As set forth above, in the present invention, after a layered film which comprises a SiGe film containing Si and Ge and an oxide film is patterned by means of dry etching to form a gate electrode pattern and a gate oxide film pattern, dry etching products and particles which are stuck onto the semiconductor substrate can be removed satisfactorily without damaging the SiGe layer and the gate oxide film which constitute the gate, and besides a semiconductor device with excellent device characteristics and good reliability can be manufactured with a high yield.

What is clamed is:

1. A method of manufacturing a semiconductor device having, on a semiconductor substrate, a gate which comprises a gate oxide film and a SiGe film containing Si and Ge; which comprising the steps of:

a patterning to form a gate electrode pattern as well as an oxide film pattern by applying dry etching to a layered film which is formed, on the semiconductor substrate, of an oxide film and the SiGe film, being laid in this order;

a first cleaning step wherein, after the step of the patterning, the semiconductor substrate is cleaned with a first cleaning solution containing hydrofluoric acid; and a second cleaning step wherein, after first cleaning step, the semiconductor substrate is cleaned with a second cleaning solution containing ammonia and hydrogen peroxide, wherein:

a content ratio (by weight) of hydrogen peroxide to ammonia in the second cleaning solution is not less than 1 (hydrogen peroxide/ammonia).

2. A method of manufacturing a semiconductor device according to claim 1, wherein:

an ammonia concentration in the second cleaning solution is 0.05 weight %–1.5 weight %.

3. A method of manufacturing a semiconductor device according to claim 1, wherein, in the second cleaning step, the temperature of the second cleaning solution in use is not higher than 45° C.

4. A method of manufacturing a semiconductor device according to claim 1, wherein a hydrogen fluoride concentration in the first cleaning solution is 0.05 weight %–1.0 weight %.

5. A method of manufacturing a semiconductor device according to claim 1, wherein the SiGe layer containing 10 atomic %–40 atomic % of Ge.

6. A method of manufacturing a semiconductor device according to claim 1, wherein the layered film is a layered film comprising an oxide film, a SiGe film and a polycrystalline silicon film, being laid in this order from the side of the substrate.

7. A method of manufacturing a semiconductor device having, on a semiconductor substrate, a gate which comprises a gate oxide film and a SiGe film containing Si and Ge; which comprising the steps of:

a patterning to form a gate electrode pattern as well as an oxide film pattern by applying dry etching to a layered film which is formed, on the semiconductor substrate, of an oxide film and the SiGe film, being laid in this order;

a first cleaning step wherein, after the step of the patterning, the semiconductor substrate is cleaned with a first cleaning solution containing hydrofluoric acid; and a second cleaning step wherein, without drying after the first cleaning step, the semiconductor substrate is cleaned with a second cleaning solution containing ammonia and hydrogen peroxide.

8. A method of manufacturing a semiconductor device according to claim 7, wherein:

an ammonia concentration in the second cleaning solution is 0.05 weight %–1.5 weight %; and a content ratio (by weight) of hydrogen peroxide to ammonia in the second cleaning solution is not less than 1 (hydrogen peroxide/ammonia).

9. A method of manufacturing a semiconductor device according to claim 8, wherein, in the second cleaning step, the temperature of the second cleaning solution in use is not higher than 45° C.

10. A method of manufacturing a semiconductor device according to claim 7, wherein a hydrogen fluoride concentration in the first cleaning solution is 0.05 weight %–1.0 weight %.

11. A method of manufacturing a semiconductor device according to claim 8, wherein the SiGe layer contains 10 atomic %–40 atomic % of Ge.

12. A method of manufacturing a semiconductor device according to claim 7, wherein the layered film is a layered film comprising an oxide film, a SiGe film and a polycrystalline silicon film, being laid in this order from the side of the substrate.

13. A method of manufacturing a semiconductor device having, on a semiconductor substrate, a gate which comprises a gate oxide film and a SiGe film containing Si and Ge; which comprising the steps of:

a patterning to form a gate electrode pattern as well as an oxide film pattern by applying dry etching to a layered film which is formed, on the semiconductor substrate, of an oxide film, the SiGe film and a polycrystalline silicon film, being laid in this order from the side of the substrate;

a first cleaning step wherein, after the step of the patterning, the semiconductor substrate is cleaned with a first cleaning solution containing hydrofluoric acid; and a second cleaning step wherein, after the first cleaning step, the semiconductor substrate is cleaned with a second cleaning solution containing ammonia and hydrogen peroxide.

14. A method of manufacturing a semiconductor device according to claim 13, wherein:

an ammonia concentration in the second cleaning solution is 0.05 weight %–1.5 weight %; and a content ratio (by weight) of hydrogen peroxide to ammonia in the second cleaning solution is not less than 1 (hydrogen peroxide/ammonia).

15. A method of manufacturing a semiconductor device according to claim 14, wherein, in the second cleaning step, the temperature of the second cleaning solution in use is not higher than 45° C.

16. A method of manufacturing a semiconductor device according to claim 13, wherein a hydrogen fluoride concentration in the first cleaning solution is 0.05 weight %–1.0 weight %.

17. A method of manufacturing a semiconductor device according to claim 13, wherein the SiGe layer contains 10 atomic %–40 atomic % of Ge.

* * * * *